United States Patent
Despesse

(10) Patent No.: US 9,151,520 B2
(45) Date of Patent: Oct. 6, 2015

(54) DEVICE FOR VARYING THE PRESSURE OF A PNEUMATIC FLUID THROUGH DISPLACEMENT OF LIQUID DROPLETS AND HEAT PUMP USING SUCH A DEVICE

(75) Inventor: Ghislain Despesse, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 889 days.

(21) Appl. No.: 13/054,629

(22) PCT Filed: Jul. 21, 2009

(86) PCT No.: PCT/EP2009/059389
§ 371 (c)(1),
(2), (4) Date: Feb. 8, 2011

(87) PCT Pub. No.: WO2010/010102
PCT Pub. Date: Jan. 28, 2010

(65) Prior Publication Data
US 2011/0138838 A1    Jun. 16, 2011

(30) Foreign Application Priority Data
Jul. 22, 2008  (FR) ...................................... 08 54984

(51) Int. Cl.
*F25B 21/02*  (2006.01)
*F25B 1/00*  (2006.01)
(Continued)

(52) U.S. Cl.
CPC . *F25B 1/00* (2013.01); *F04B 17/00* (2013.01); *F04B 19/006* (2013.01); *F04B 35/00* (2013.01);
(Continued)

(58) Field of Classification Search
CPC .......... F25B 21/02; F25B 21/04; F25B 27/00; H01L 35/30
USPC .......................... 62/3.2–3.3, 116, 500; 417/48
See application file for complete search history.

(56) References Cited

U.S. PATENT DOCUMENTS 2,875,695 A    3/1959  Justice
4,636,785 A    1/1987  Le Pesant
(Continued)

FOREIGN PATENT DOCUMENTS

EP    1 270 066 A2    1/2003
EP    1 321 736 A3    6/2003
(Continued)

OTHER PUBLICATIONS

French Preliminary Search Report for 08 54984 dated Feb. 3, 2011.
(Continued)

*Primary Examiner* — Melvin Jones
(74) *Attorney, Agent, or Firm* — Pearne & Gordon LLP

(57) ABSTRACT

A heat pump including at least two devices for displacement of droplets of liquid by electro-wetting, where one includes a control unit such that it forms a compressor of the pneumatic fluid confined between the droplets of liquid, where the other includes a control unit such that it forms an expander to expand the pneumatic fluid confined between the droplets of liquid, where the high-pressure end of the compressor is connected to the high-pressure end of the expander through a thermal exchanger of a hot source, and where the low-pressure end of the expander is connected to the low-pressure end of the compressor through a thermal exchanger with a cold source, and where the unit formed by the compressor, the expander, and the thermal exchangers forms a single channel.

31 Claims, 10 Drawing Sheets

(51) Int. Cl.
  *F04B 17/00* (2006.01)
  *F04B 19/00* (2006.01)
  *F04B 35/00* (2006.01)
  *F25B 30/02* (2006.01)
  *H01L 23/473* (2006.01)
  *F25B 41/00* (2006.01)
  *F28F 3/12* (2006.01)

(52) U.S. Cl.
  CPC .............. *F25B 30/02* (2013.01); *H01L 23/473* (2013.01); *F25B 41/00* (2013.01); *F28F 3/12* (2013.01); *F28F 2250/08* (2013.01); *H01L 2924/0002* (2013.01); *Y10T 137/206* (2015.04)

(56) References Cited

U.S. PATENT DOCUMENTS

| | | | |
|---|---|---|---|
| 5,005,639 | A | 4/1991 | Leland |
| 6,318,970 | B1 | 11/2001 | Backhouse |
| 6,888,721 | B1 | 5/2005 | Moghaddam et al. |
| 8,730,109 | B2 | 5/2014 | Despesse |
| 2004/0007377 | A1 | 1/2004 | Fouillet et al. |
| 2004/0055891 | A1* | 3/2004 | Pamula et al. ................ 205/98 |
| 2006/0090474 | A1* | 5/2006 | Sauciuc et al. ................ 62/3.2 |
| 2010/0095762 | A1 | 4/2010 | Despesse |

FOREIGN PATENT DOCUMENTS

| | | |
|---|---|---|
| EP | 1 489 303 A2 | 12/2004 |
| FR | 2 543 320 A1 | 9/1984 |
| FR | 2 841 063 A1 | 12/2003 |
| JP | 09-287517 A | 11/1997 |
| WO | 03/023798 A2 | 3/2003 |
| WO | 2006/134307 A1 | 12/2006 |

OTHER PUBLICATIONS

International search Report for PCT/EP2009/059389 dated Jan. 14, 2010.

Hartshone; "Ferro-fluid-based microchip pump and valve", Sensors and Actuators B, Elsevier Sequioa, CH, vol. 99, May 2004, pp. 592-600.

Pollack et al; "Electrowetting-based actuation of droplets for integrated microfluidics", Lab Chip 2 (1) Published Mar. 11, 2002, pp. 96-101.

Baviere et al; "Dynamics of droplet transport induced by electrowetting actuation", in Microfluid Nanofluid, vol. 4, No. 4, Apr. 2008.

International Preliminary Report for PCT/EP2009/059389 dated Mar. 31, 2011.

* cited by examiner

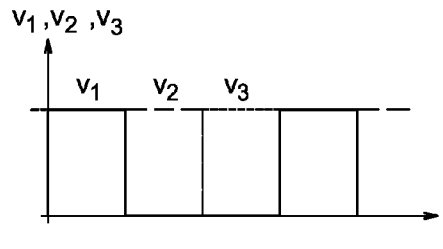
FIG. 3A
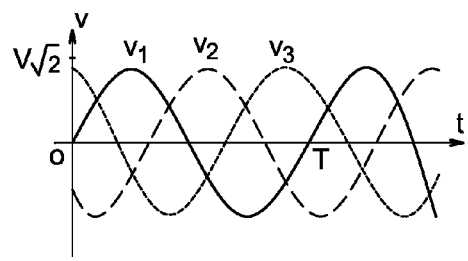
FIG. 3B
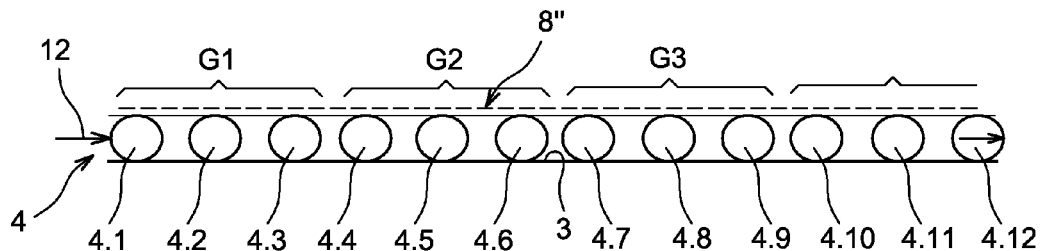
FIG. 4
|  | $t_1$ | $t_2$ | $t_3$ | $t_4$ | $t_5$ | $t_6$ | $t_7$ | $t_8$ | $t_9$ | $t_{10}$ |
|---|---|---|---|---|---|---|---|---|---|---|
| $V_1$ | V | 0 | V | V | 0 | 0 | V | 0 | 0 | V |
| $V_2$ | V | V | 0 | V | V | 0 | 0 | V | 0 | 0 |
| $V_3$ | 0 | V | V | 0 | V | V | 0 | 0 | V | 0 |
| $V_4$ | 0 | 0 | V | V | 0 | V | V | 0 | 0 | V |
| $V_5$ | V | 0 | 0 | V | V | 0 | V | V | 0 | 0 |
| $V_6$ | 0 | V | 0 | 0 | V | V | 0 | V | V | 0 |
| $V_7$ | 0 | 0 | V | 0 | 0 | V | V | 0 | V | V |
| $V_8$ | V | 0 | 0 | V | 0 | 0 | V | V | 0 | V |
| $V_9$ | V | V | 0 | 0 | V | 0 | 0 | V | V | 0 |
| $V_{10}$ | 0 | V | V | 0 | 0 | V | 0 | 0 | V | V |
FIG. 5

DEVICE FOR VARYING THE PRESSURE OF A PNEUMATIC FLUID THROUGH DISPLACEMENT OF LIQUID DROPLETS AND HEAT PUMP USING SUCH A DEVICE

TECHNICAL FIELD AND PRIOR ART

The present invention relates to a device for varying the pressure of a pneumatic fluid through displacement of liquid droplets, to a heat pump implementing such a device, and an electrical energy generator implementing such a device.

Heat pumps of known types are used as heating systems for dwellings, or as air-conditioning devices for dwellings or a cooling system for a refrigerator.

A heat pump comprises a closed circuit in which a refrigerating fluid circulates which changes state and is transformed from a liquid state to a vapour state, the pressure and temperature of which vary. The circuit comprises a condenser, an expander, an evaporator and a compressor. The refrigerating fluid travels between a cold source and a hot source, and makes a heat transfer between the two.

The purpose of the compressor is to increase the pressure and temperature of the refrigerating fluid.

Ordinarily, the compressor is a piston pump or an electrically powered turbine, which creates a pressure difference sufficient to transform the refrigerating fluid from its gaseous state to its liquid state.

Heat pumps, which are found for example in refrigerators, have the disadvantage, in addition to the noise, of locally creating a substantial pressure gradient and therefore a substantial temperature gradient, leading to thermal losses and thus to a lesser overall efficiency. In addition, the structure of this type of heat pump is fixed on construction, and it is not possible to modify its operation according to variations of the external conditions. Their operation is not therefore optimised.

In addition, to ensure a change of state with a satisfactory efficiency, it would be preferable for the pressure to be just above or just below the threshold at which the change of state occurs. This threshold depends on the temperatures of the cold and hot sources, and these temperatures can vary. Thus, a safety margin is adopted in order to be sure, whatever these temperatures may be, that the pressure threshold is exceeded, the effect of which is to reduce the efficiency.

There are also heat pumps of the Stirling type, which exploit a mechanical-thermal instability to convert a temperature difference into mechanical energy, or vice versa. This is, in fact, a resonant structure, which makes a gas make return journeys from one chamber to another where there are different pressure and temperature conditions in each chamber. To obtain a satisfactory efficiency in this type of machine it is necessary that the movement of the gas from one chamber to another is adiabatic, i.e. that the gas which travels, via a channel known as a "regenerator", from one chamber to the other, follows the temperature gradient in the channel, whilst ensuring that this channel does not have a high volume compared to that of the chambers. It is therefore necessary that this channel contains compounds with a high thermal capacity to ensure the stability of the thermal gradient, and that at the same time that it is not the equivalent of a thermal bridge between the two chambers. In addition, the volume of this regenerator must be limited; it is therefore necessary to find a compromise between a long and fine structure, which risks constituting substantial charge losses (losses due to substantial friction of the gas against the walls of the channel), and a broad and short structure, which leads to a thermal short-circuit between the two chambers. Which makes the design of this type of heat pump very complex.

It is consequently an aim of the present invention to offer a heat pump the efficiency which is optimised, and which is capable of adapting to the external conditions.

It is, more generally, an aim of the present invention to offer a device capable of causing the pressure of a pneumatic fluid of great operational flexibility to be varied, and enabling a modification of the variation of the pressure sought.

ACCOUNT OF THE INVENTION

The aims described above are attained by a device comprising a pipe, several droplets of hydraulic fluid separated, two by two, by a pneumatic fluid, a system of displacement of the droplets by electro-wetting or by electromagnetic forces, and a unit controlling the displacement of the droplets capable of causing the pressure of the pneumatic fluid confined between the droplets to vary.

In other words, the droplets of hydraulic fluid are used as pistons, and the inter-droplet space as compression or expansion chambers, and the displacement of the droplets is obtained by electrostatic forces or electromagnetic forces. The droplets and the inter-droplet spaces form a set of pumps in series. Since the hydraulic fluid is essentially incompressible, the displacement of a droplet is converted almost completely into a pressure variation. Using the invention, a deliberate increase or reduction of the gas pressure between the liquid droplets is obtained. For example, the device comprises at least three successive volumes of gas separated by liquid droplets, where the pressure is increasing or decreasing gradually in the three successive volumes of gas.

The invention therefore consists in causing a succession of liquid droplets (for example, water) to be moved in a channel, between which droplets a gas is confined, and the pressure of which is able to change according to the inter-droplet volume.

In the case of the use of a heat pump, an increase of the inter-droplet pressure is caused when the droplets come close to a zone where it is desired to contribute heat, and a reduction of the inter-droplet pressure is caused when the droplets come close to a zone where it is desired to extract heat.

Thus, contrary to known heat pumps, the operation of the heat pump according to the present invention does not use a change of gas/liquid state, nor a transfer of gas between two chambers via a passive regenerator, but a gradual and controlled variation of the pressure of a gas in a channel. This pressure variation, instead of occurring via a pump or a gas turbine, is applied very gradually, causing either an almost adiabatic displacement of the gas, or an almost lossless transfer of thermal energy, i.e. with a low, continuous temperature difference.

The pressure and the temperature can easily be adjusted for the operating conditions by modifying the control of the means of displacement.

Indeed, each gas bubble surrounded by two droplets of water can be subjected to the desired pressure, enabling any variations of pressure in space or in time to be accomplished.

Means for displacement of multiple droplets of hydraulic fluid are therefore used by electrostatic forces or by electromagnetic forces to modify the pressure of a pneumatic fluid confined between said droplets, by modifying the volume between the droplets.

The subject-matter of the present invention is thus a device for varying the pressure of a fluid, comprising a channel in which travel multiple droplets of hydraulic fluid which are at some distance from one another, and means for displacement of said droplets between the first and the second end of the pipe, where the means of displacement use electrostatic or electromagnetic forces, characterised in that said driven fluid is a pneumatic fluid confined in airtight fashion between the droplets of hydraulic fluid, and where the forces applied by said means of displacement are such that the volume between the droplets increases or is reduced gradually in a given displacement direction, respectively causing a compression or an expansion of the pneumatic fluid in a gradual manner.

The device may comprise at least successive first, second and third volumes of pneumatic fluid, where the pressure of the pneumatic fluid increases or is reduced gradually from the first to the third volume of gas.

In the case of a displacement by means of electrostatic forces, said means of displacement may comprise a reference electrode, with which the droplets are in permanent contact, and separate displacement electrodes able to be charged to a variable potential, and where the displacement electrodes are grouped in groups of n electrodes succeeding one another in the displacement direction of the droplets, and where the control unit applies an identical control to each of the groups in order to cause greater closeness of greater distance between the droplets in the displacement direction of the droplets.

In one embodiment, the distance separating the displacement electrodes is reduced or increased in an unvarying manner in the displacement direction of the droplets, where said means of displacement are controlled by a n-phase voltage, n being, for example, equal to 3; in this case control is accomplished simply by using a triphase power supply.

In another embodiment, said displacement electrodes are of variable dimension, in an unvarying manner, in the displacement direction of the droplets.

In the case of a displacement by means of electromagnetic forces, said means of displacement can comprise multiple magnetic field generators, where said generators are grouped into groups of n generators succeeding one another in the displacement direction of the droplets, and where the control unit applies an identical control to each of the groups to cause greater closeness or greater distance between the droplets in the displacement direction of the droplets.

In one embodiment, the distance separating said generators can be reduced in the displacement direction of the droplets, where said means of displacement are controlled by a n-phase voltage where n being for example, equal to 3.

Advantageously, the inner surface of the pipe is non-wetting in relation to the droplets, i.e. a hydrophobic surface in the case of an aqueous solution, and an oleophobic surface in the case of a greasy substance.

Another subject-matter of the present invention is a heat pump comprising at least two devices according to the present invention, where at least one comprises a control unit such that it forms a compressor of the pneumatic fluid, where at least one other device comprises a control unit such that it forms an expander to expand the pneumatic fluid, where said pump also comprises at least one thermal exchanger linking the compressor to the expander, and where the compressor, the expander and the thermal exchanger form a single channel.

In one embodiment, where the high-pressure end of the compressor is connected to the high-pressure end of the expander through a thermal exchanger of a hot source, and the low-pressure end of the expander with a cold source, where the unit formed by the compressor, the expander and the thermal exchangers forms a single channel, where the pressures of the pneumatic fluid in the thermal exchangers are such that the temperature of the pneumatic fluid in the thermal exchanger of the hot source is higher than a first temperature, and a temperature of the pneumatic fluid in the thermal exchanger of the cold source is lower than the second temperature.

The thermal exchangers can be formed by pipes fitted with means for displacement using electrostatic forces or electromagnetic forces, where each of these exchangers comprises a control unit to control the pressure and temperature of the pneumatic fluid confined between the droplets.

For example the heat pump according to the invention may comprise a single control unit for the compressor, the expander and the thermal exchangers, where the latter sends separate orders to each one.

It is possible to design the heat pump to comprise several devices forming compressors, several devices forming expanders, and several thermal exchangers.

In a particularly advantageous manner, where the devices forming the compressor and the expander comprise thermal flow sensors on the walls of the pipes in order to measure the thermal flow between the outside pipe, the control unit is able to act on the means of displacement to reduce the absolute value of the thermal flow, so as to obtain compressions and expansions which are essentially adiabatic.

The thermal exchangers can advantageously comprise flow sensors enabling the control unit to regulate the displacement of the droplets in order to maintain a thermal flow which is essentially constant.

The heat pump according to the invention may comprise means for calibrating the size of the droplets in the circuit and their relative positions. For example, these means of calibration comprise a tank fitted with an orifice to let in the used droplets and an orifice for supply of the circuit of renewed droplets, and means for forming droplets by electro-wetting, where the tank collects the used droplets, and the means for formation of droplets uses the collected hydraulic fluid to form a new droplets.

The means for formation of droplets can comprise a ramp emerging from the collected hydraulic fluid, and connected to the supply orifice, where the ramp forms, for example, the electrode of reference, and where the displacement electrodes are positioned opposite it.

In another heat pump embodiment, the pipe is open and comprises open ends communicating either with the hot source, or with the cold source, and where the pneumatic fluid is subject to the expansion, and where the compression is of air taken from the hot source or the cold source, and where the thermal exchanger exchanges heat with the cold source or the hot source.

In another heat pump embodiment, the pipe is open and comprises open ends, where one of the open ends is located in the hot source and the other end in the cold source, and where the pneumatic fluid is the air which is drawn in from the hot source or the cold source, and is released into the cold source or the hot source, respectively, and where the thermal exchanger is located in the hot source or the cold source, such that there is an exchange of air between the hot source and the cold source.

Another subject-matter of the present invention is also a system for cooling an electronic chip comprising a heat pump according to the invention, in which the single channel of the heat pump is formed in the rear face of said chip, where the single channel is formed by a first spiral forming the thermal exchanger with the cold source formed by the chip and the compressor, where a second spiral forms the thermal exchanger with the hot source formed by the external environment and the expander, where the first spiral surrounds the second spiral, and where the cooling system comprises a radiator on the heat pump on the opposite side of the electronic chip, with the single channel winding under the radiator. The first spiral is such that it enables a thermal exchange directly with the external environment, in addition to the exchange with the radiator.

The single channel can be engraved directly in the rear face of the electronic chip, or be engraved in an insulating plate added on to the chip.

The single channel is advantageously positioned in two parallel planes.

Another subject-matter of the present invention is a device for converting thermal energy into electrical energy comprising at least two devices according to the invention, one comprising a control unit such that it forms a compressor of the pneumatic fluid, where the high-pressure end of the compressor is connected to the high-pressure end of the expander through a thermal exchanger of a hot source at a first temperature, and where the low-pressure end of the expander is connected to the low-pressure end of the compressor by a thermal exchanger with a cold source at a second temperature, where the unit formed by the compressor, the expander and the thermal exchangers forms a single channel, and where the pressures of the pneumatic fluid in the thermal exchangers are such that the temperature of the pneumatic fluid in the thermal exchanger of the hot source is lower than the first temperature, and the temperature of the pneumatic fluid in the thermal exchanger of the cold source is higher than the second temperature.

The thermal exchangers can be formed by pipes fitted with means for displacement using electrostatic forces or electromagnetic forces, where each of these exchangers comprises a control unit to control the pressure and temperature of the pneumatic fluid confined between the droplets.

BRIEF DESCRIPTION OF THE ILLUSTRATIONS

The present invention will be better understood using the description which follows and the appended illustrations, in which:

FIG. 1 is a schematic representation of a first example of a section of a pipe allowing the variation of the pressure according to the present invention using the electrostatic forces, FIG. 1' is a schematic representation of a droplet in a section of pipe according to the present invention;

FIG. 2 is a schematic representation of a second example of a section of a pipe allowing the variation of the pressure according to the present invention using the electrostatic forces, FIGS. 3A and 3B are graphical representations of the voltages controlling the pipe of FIG. 2, FIG. 4 is a schematic representation of a third example of a section of a pipe allowing the variation of the pressure according to the present invention using the electrostatic forces, FIG. 5 is a panel controlling a sub-group of electrodes for the pipe of FIG. 4 allowing the inter-droplet volume to be kept essentially constant, FIG. 6A is a graphical representation of a heat pump according to the present invention, FIG. 6B is a detailed view of FIG. 6A in the area of a thermal exchanger of the heat pump, FIG. 6C is a diagram of the thermal transfers between a thermal exchanger according to the invention and a hot source, FIG. 6D is a graphical representation of the Joule-Brayton cycle, FIG. 7 is a schematic representation of a generator of liquid droplets suited to the present invention, FIG. 8 is a variant embodiment of a heat pump comprising several hot zones, FIGS. 9A to 9C are different views of a system for cooling an electronic chip according to the invention, FIGS. 10A and 10B are schematic representations of an example of an embodiment of a pipe allowing variation of the pressure according to the present invention, using the electromagnetic forces;

DETAILED ACCOUNT OF PARTICULAR EMBODIMENTS

In the disclosure which follows we shall disclose principally devices implementing a displacement by electro-wetting. We shall therefore firstly disclose, in a general manner, the displacement of the liquid droplets using the principle of electro-wetting. However, devices using means of displacement implementing electromagnetic forces come within the scope of the present invention, as we shall see in due course.

The pneumatic fluid confined between two droplets may be a gas or a mixture of gases, such as air. For the sake of simplification we shall designate this fluid simply by "gas"; however all the devices applied to mixtures of gases.

Displacement by electro-wetting of liquid droplets on a dielectric medium is, for example, disclosed in the article of M. G. Pollack, A. D. Shendorov, R. B. Fair, entitled "*Electro-wetting-based actuation of droplets for integrated microfluidics*", Lab Chip 2 (1) (2002) 96-101.

The forces used for the displacement are electrostatic forces.

Document FR 2 841 063 discloses a device implementing a catenary opposite the electrodes activated for the displacement.

The principle of this type of displacement is as follows: a droplet rests on a network of electrodes, from which it is insulated by a dielectric layer and a hydrophobic layer.

When an electrode in proximity to the droplet is activated, the dielectric layer and the hydrophobic layer, between this activated electrode and the droplet polarised by an electrode, act like a capacity. The effects of electrostatic charge induce the displacement of the droplet on this electrode. The electrode may be a catenary; it then maintains an electrical contact with the droplet during its displacement, as disclosed in document FR 2 841 063.

The droplet may thus be displaced gradually, over the hydrophobic surface, by successive activation of the electrodes in the matrix of electrodes, and by guidance along the catenary.

Figure 1:
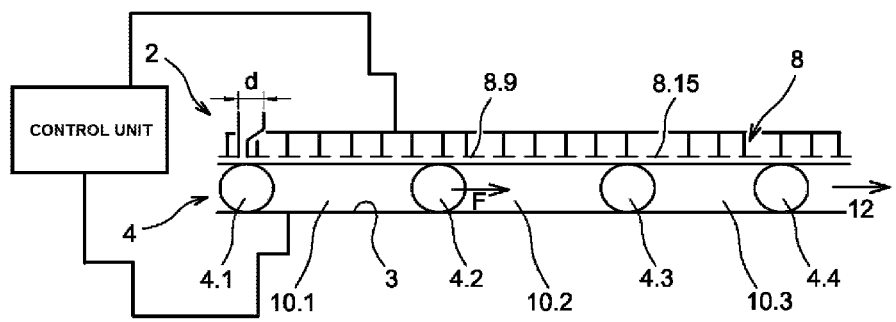
Figure 1:
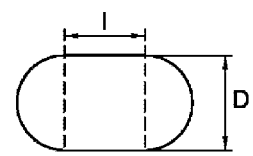

According to the present invention, and as it is represented in FIG. 1, the device for varying the pressure comprises a pipe 2, for example of tubular shape comprising an electrode, designated henceforth as reference electrode 3, able to impose a potential on liquid droplets 4 which come into contact with it. In the example represented, this electrode 3 is deposited on the internal surface of the pipe along the entire length of the pipe, such that the droplets remain permanently in contact with the electrode. It would be possible to have a catenary suspended in the pipe.

The device also comprises multiple separate electrodes 8, designated henceforth as the displacement electrodes, deposited on the outside face of the pipe such that they are not in contact with the droplets. The separate electrodes are positioned along the entire length of the pipe, drawing a path.

Each electrode 8 is linked to a source of potential and can have a given potential applied to it.

The body of the pipe is advantageously made from a dielectric material; thus, a droplet, the body and an electrode 8 form a condenser, and the application of a potential to electrode 8 causes the appearance of a potential difference between the droplet and electrode 8, and the attraction of the droplet by electrode 8.

The inner wall of the pipe has hydrophobic properties in relation to the liquid droplets, reducing friction.

The liquid droplets 4 are separated by a gas, and a pair of liquid droplets forms an airtight chamber filled with gas.

It is supposed that the liquid droplets have airtight contact with the entire inner wall of the pipe, confining the gas. Consequently, under normal operation, there is no movement of gas between two inter-droplet spaces.

FIG. 1 shows four droplets 4.1, 4.2, 4.3 and 4.4 demarcating, two-by-two, chambers 10.1, 10.2 and 10.3

According to the present invention, the inter-droplet volumes 10.1, 10.2 and 10.3 are used as gas compression chambers. This compression is obtained by displacement of the droplets 4.1 to 4.4 forming airtight pistons.

To this end, according to the present invention, the separate electrodes are controlled individually, causing a reduction of the volume of chambers 10.1 to 10.3.

In the represented example, the pipe has a diameter which is essentially constant, and the variation of the volume is then obtained by varying the inter-droplet distance. The pipe may of course have a variable diameter, and also have, for example, a flared or narrowing shape. In this case, it is possible to envisage retaining an inter-droplet distance which is essentially constant, and where the pressure is obtained directly by varying the section of the pipe. The pressure variation may also be obtained simultaneously by varying the section of the pipe and by varying the distance between the droplets.

We shall disclose a step of compression of the gas contained in chambers 10.1 to 10.3.

In this embodiment the separate electrodes are all of the same size and separated by a constant interval d, and the section of the droplets is equal to that of the pipe, and also equal to S.

It is supposed that the pressure of the fluid in the chambers is initially equal to P.

Electrode 8.9 is activated, droplet 4.2 then moves by a distance D in the direction of arrow 12, and the volume of chamber 10.2 is reduced, by a volume equal to S*D.

Considering that the electrostatic force applied to the droplet is equal to F, where the latter is essentially incompressible, it transmits this force to the gas, and the pressure in the chamber 10.1 is then equal to:

$P10.2 = P + F/S$

After this, by activating electrode 8.15, droplet 4.3 is displaced by d, and the pressure in chamber 10.3 is equal to:

$P10.3 = P10.2 + F/S$ $P10.3 = P + 2F/S$.

There has therefore been an increase of the pressure between the gas of chamber 10.1 and the gas of chamber 10.3.

In the disclosed example, only three chambers have been represented, but the device according to the invention of course comprises a large number of chambers demarcated by two liquid droplets. By using at least three inter-droplet chambers, a gradual increase of the pressure of the gas between two droplets is obtained through a gradual action. A gradual increase of the temperature is also obtained.

All the droplets are displaced and move in the pipe. The supply of droplets to an inlet end of the device is continuous. Consequently, a movement of gas and a compression of it occur continuously. At the second end of the tube a continuously compressed pressurised fluid is then obtained.

The value of the electrostatic force F may be adjusted, not only by adjusting the difference of potential between the reference electrode and the displacement electrodes, but also by means of the value of the phase-lead of the displacement electrodes activated relative to the current position of the droplet at the time when the displacement electrodes are activated.

Moreover, this system to increase the pressure is silent, since no mechanical part is moving. In addition, there is no wear and tear.

In this embodiment, each displacement electrode is controlled individually; this then gives it the advantage that it is very flexible when the pipe comprises a large number of electrodes. Indeed, the larger the number of electrodes the easier it is to position each droplet precisely, which therefore enables the pressure and temperature to be better controlled. In order to obtain such an individual control, as many independent controls as there are electrodes are used. In the case of a very large number of electrodes the electronic embodiment can become very complex.

Advantageously, and as we shall see in due course, the device according to the present invention is particularly suitable for undertaking adiabatic phases of compression and expansion, since it easily enables the gas temperature to be adjusted, and this adjustment may be accomplished as a function of the external temperature.

We have described the compression of the gas, but the device is of course equally suitable for gas expansion, i.e. a reduction of its pressure, by controlling the displacement electrodes so as to cause an increase of the volume of the inter-droplet chambers.

Figure 2:
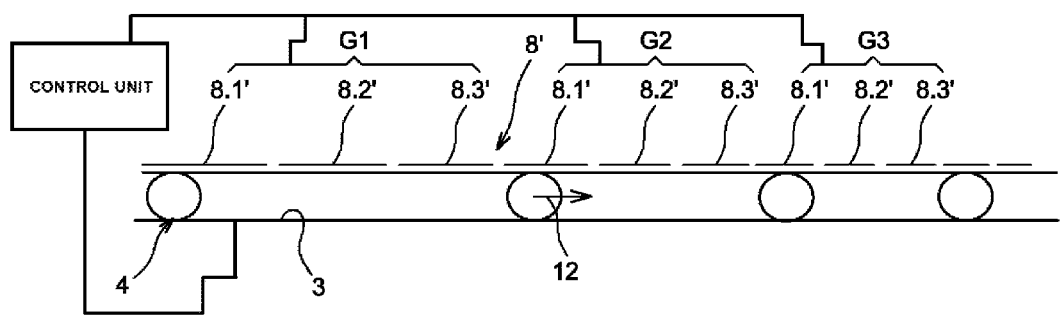

FIG. 2 shows a second example of an embodiment of the device for varying pressure, with a simplified control.

The device in FIG. 2 comprises a reference electrode 2 and displacement electrodes 8'. In this example the electrodes are of different sizes; they are separated by an interval which can vary, allowing, simply by powering with a multiphase current, a variation in pressure to be caused.

The electrodes 8' are distributed into groups of electrodes G1, G2, G3 of different sizes; in the represented example the electrodes decrease in size in the direction of arrow 12, and more specifically their dimension decreases in the direction of arrow 12.

Each group comprises an electrode capable of being activated simultaneously with an electrode of each other group.

In the represented example the control is of the triphase type; each group G1, G2, G3 comprises three electrodes 8.1', 8.2', 8.3'; all the electrodes 8.1', are connected together, all the electrodes 8.2' are connected together, and all the electrodes 8.3' are connected together.

FIG. 3A shows a graphic representing a rectangular triphase voltage with voltage V1, V2, V3 as a function of time.

FIG. 3B shows a graphic representing a sine-wave triphase voltage with voltage V1, V2, V3 as a function of time.

We shall now explain the operation of this device.

It is considered that the droplets are positioned under the electrodes having the highest difference of potential relative to that of the reference electrode in absolute terms. Thus, when all the electrodes 8.1' are activated the droplets positioned beneath the electrodes 8.1' are attracted by the electrodes 8.2', and become positioned under the electrodes 8.2'. Then, when the electrodes 8.3' are activated the electrodes pass under the electrodes 8.3'. And finally, when the electrodes 8.1' are activated once again, the droplets become positioned under the electrodes 8.1'.

Due to the decrease in the size of the electrodes, and possibly due to the interval between the electrodes, in an unvarying fashion, there is a reduction of the inter-droplet volume; the gas is then compressed.

As with the device of FIG. 1, the droplets travel continuously, and the fluid is continuously compressed.

To obtain a reduction of the pressure the droplets need merely be displaced in the direction of the increasing electrodes.

In the zones where the electrodes are long and spaced out the inter-droplet space is substantial and the pressure and/or temperature low and, conversely, in the zones where the electrodes are narrow and close together the inter-droplet space is reduced and the pressure and/or temperature is (are) high.

This device has the advantage that it has a very simple control; indeed a single triphase current or voltage control is sufficient to operate this device.

It is well understood that this device can operate with a control comprising a number of phases other than 3; and the number of electrodes per group is proportional to the number of phases.

This device is particularly suitable, for example, for the manufacture of refrigerators. Since the length of the pipe is constant for a type of refrigerator it can be manufactured in large series, thereby reducing its cost; its control is also simplified.

It is also possible to envisage having electrodes of a given size, separated by an increasing or reducing distance, which then avoids the need to have electrodes which become longer than the droplets which they displace.

FIG. 4 shows a third example of an embodiment of a device for varying pressure according to the present invention.

In the represented example the device comprises a pipe 2, a reference electrode 4 and displacement electrodes 8". The displacement electrodes are all of the same size and spaced with a constant interval.

The electrodes are controlled in groups, G1, G2, G3, etc. In the represented example the groups comprise ten electrodes, and the groups are positioned all along the pipe.

At each moment an identical control is applied to each of the groups. A control consists in applying a voltage to a certain electrode and not to others, in order to separate or bring together droplets within a given group, in order to cause a compression or expansion, respectively.

To change the inter-droplet distance and/or the pressure along the channel, for example to cause its temperature to change, each group $G_i$ of n electrodes succeeding one another need merely be controlled with a different pattern such as, for example, by modifying the average number of droplets per group. To do so, if it is desired to reduce the inter-droplet volume, the group is given an alternate activation of 10/3 electrodes (cf. table in FIG. 5), which leads to 3.33 droplets per group, and the following group is given an alternate activation of even and odd electrodes, leading to one droplet, on average, for every other electrode. There is therefore indeed a reduction of the inter-droplet volume.

As an example, the following dimensions can be given for a device according to the invention:

The inner diameter of the channel can be, for example, 5 mm, and the diameter of the droplets in the natural state (spherical shape) can be 6 mm; when the droplet is introduced into the channel, it takes the lengthened shape (represented in FIG. 1') of the type of a cylinder of diameter D of 5 mm, and the remainder of the initial diameter provides a minimal pressure of the droplets on the wall of the channel to ensure sealing, since the droplet exerts an effort on the wall in attempting to recover its spherical shape. The size of the electrodes can be of the order of the length of the part of the droplet in contact with the channel. In this case this length l is of the order of 2.4 mm. The shapes of the displacement electrodes can differ. These electrodes can form complete rings, i.e. a tube of length 2.4 mm in the case of an electrode 3 of the central filament type. If electrode 3 is deposited on one side of the channel the displacement electrodes can have the shape of a portion of a tube cut in the direction of its length.

The device according to the present invention is particularly suitable for the manufacture of heat pumps. Indeed, the device enables a compressor and an expander to be produced simply. Moreover, it can be used as a thermal exchanger with a hot source and a cold source.

Figure 6A:
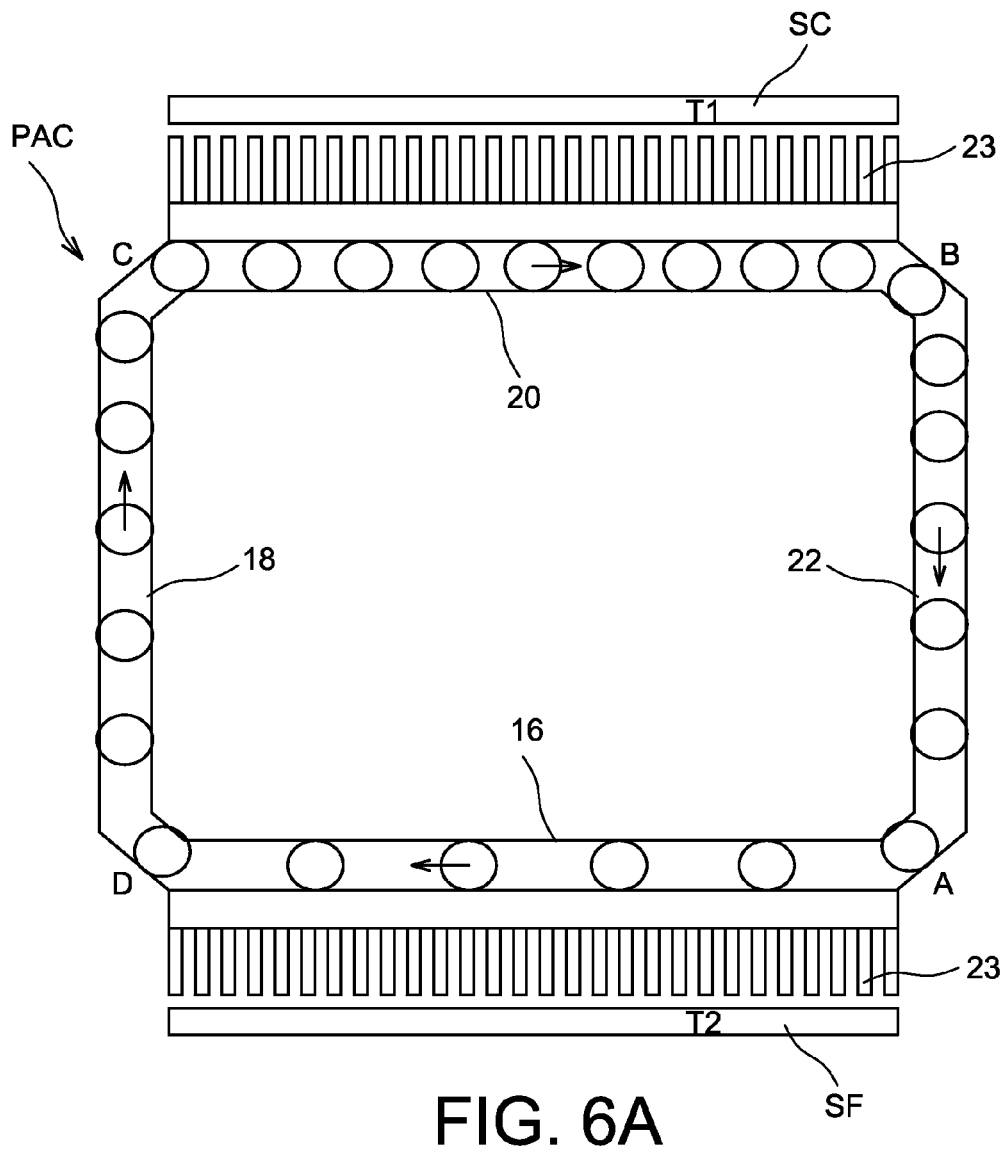

FIG. 6A represents schematically a heat pump, "PAC", according to the invention.

The heat pump "PAC" comprises, connected in series, a thermal exchanger 16 with a cold source SF between A and D, a compressor 18 between D and C, a thermal exchanger 20 between C and B with a hot source SC and an expander 22 between B and A.

The compressor 18 and the expander 22 according to the present invention are manufactured in accordance with one of the devices disclosed in relation with FIGS. 1 to 4.

Thermal exchangers 16 and 20 also comprise a pipe with a reference electrode and displacement electrodes, in which the displacement electrodes are controlled so as to enable the inter-droplet distance to be kept essentially constant. 23 designate radiators of the thermal exchangers.

The device in FIG. 4 in relation with the control represented in the table in FIG. 5 is suitable for forming such exchangers. The control in FIG. 5 is naturally one example; any other suitable control can be used.

The table in FIG. 5 represents the voltage control of each electrode of a group, as a function of time. For example, at instant t1, electrodes V1, V2, V5, V8 and V9 are at potential V, whereas electrodes V3, V4, V6, V7 and V10 are at a zero potential. This control is applied to all the groups.

The droplets of liquid are numbered from 4.1 to 4.12.

At instant t1, the droplets have the position as represented in FIG. 4.

When the control at instant t2 is applied:
droplet 4.1 moves towards electrode V3,
droplet 4.2 moves towards electrode V6,
droplet 4.3 moves towards electrode V10,
and so forth with the other droplets.

It is observed that the distances between droplets 4.1, 4.2 between 4.2 and 4.3, etc., have not changed.

When the controls are applied at instants t3 to t10, the inter-droplet distances are kept essentially constant.

The example embodiment of FIG. 4 has the advantage that it enables all heat pumps to be manufactured with a single device structure; only the controls change according to the function of each of the parts. This is thus only an electronic adaptation.

Figure 6B:
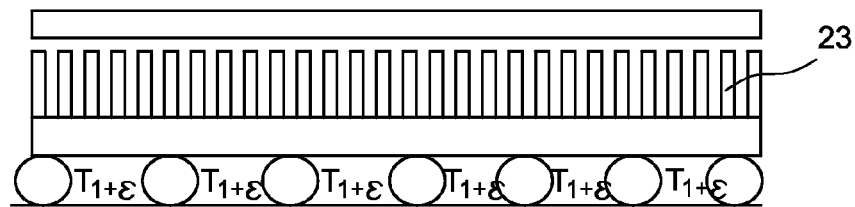
Figure 6C:
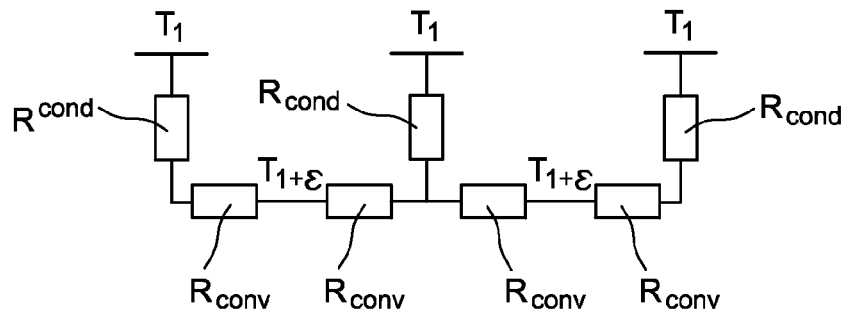
Figure 6D:
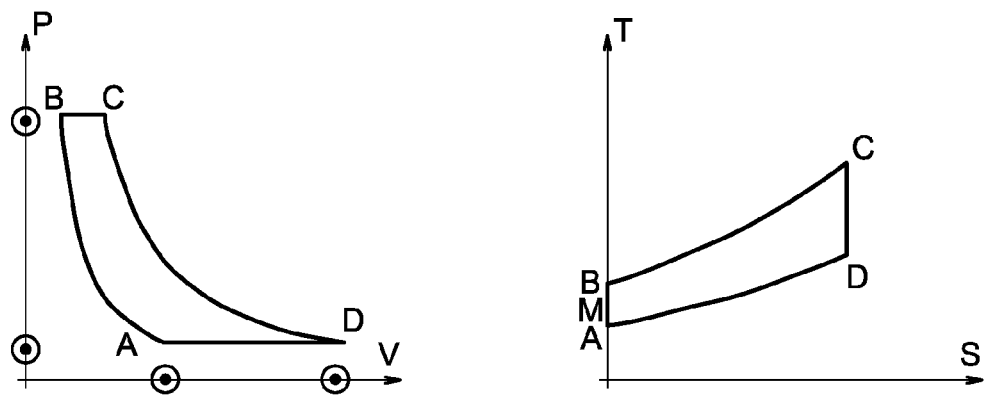

We shall now describe the operation of each of the zones of the heat pump in accordance with the Joule-Brayton thermodynamic cycle represented in FIG. 6D.

From point D to point C is one compression phase. There is a gradual rise of the pressure of the gas trapped between the droplets of liquid. Each droplet is, in fact, subjected to an electrostatic force in direction D to C, the effect of which is to subject each of the inter-droplet spaces located at C to a combined effort applied to all the droplets positioned upstream in the direction D to C.

Over the cycle this is a step with constant entropy, with an increase of the pressure and temperature of the gas. If the section of the pump forming the compressor is of sufficient length it may be considered that the thermal flow between C and D due to the thermal conductivity of the pipe may be viewed as negligible; the inter-droplet pressure is then such that the temperature of the gas follows the thermal gradient of the pipe; the rise in pressure may therefore be considered as being adiabatic, i.e. having no exchange of heat with the exterior, or almost none.

By choosing a long tube the distance between the gas at low temperature and that at high temperature is substantial, and the risk that the pipe itself may form a thermal short-circuit is therefore reduced. A weakly thermally conductive material can advantageously be chosen to reduce still further the risk of a thermal short-circuit.

The gas has been heated; this quantity of stored heat will then be used to heat the external environment formed by the hot source SC. The gas, still confined between two droplets of liquid, arrives in zone C-B forming the thermal exchange 20. From point C to point B, there is an adjustment of the pressure so as to emit heat continuously to the hot source SC at temperature T1.

Generally, in order to have a thermal flow in the direction of the hot source SC a temperature difference greater than that actually desired ultimately is created between the hot source SC and the cold source SF, which is at a temperature T2. In fact, it is desired to reach a difference equal to T1−T2, but a difference equal to T1−T2+2∈ is imposed, by imposing on the gas on the side of the hot source a temperature equal to T1+∈, and on the side of the cold source a temperature equal to T2−∈.

The theoretical efficiency is inversely proportional to the generated temperature difference. It is therefore preferable to have a small value of ∈.

By means of the invention it is possible to maintain the gas contained in the inter-droplet spaces at a temperature T1+∈, slightly higher than T1, since ∈ is small, by adjusting the pressure, such that there is a continuous thermal flow throughout the length of the exchanger, as is represented in FIG. 6B. FIG. 6C shows a schematic representation of the thermal transfers between the droplets and the gas and between the gas and the pipe; Rconv designates the thermal convection resistances between the gas and the droplets 4, and Rcond designates the thermal conduction resistances between the gas and the pipe.

It is preferable to maintain a temperature differential which is essentially constant, and small, along the entire length of the thermal exchanger, which maximises the global flow whilst restricting the temperature difference c, which is a source of energy losses.

Step CB is step subject to constant pressure.

From point B to point A the expansion of the gas is caused. Expansion is obtained by increasing the distance of the droplets of liquid; the temperature of the gas follows the temperature gradient of the pipe, causing an almost adiabatic transfer from the hot source SC at temperature T1 to the cold source SF at temperature T2 of the gas, in a manner similar to the rise in pressure between D and C. To do so the control unit alters the displacement of the droplets in order to modify the pressure such that the gas temperature is equal to or near that of the external environment.

The fluid then enters again into a new step of thermal exchange to recover heat from the cold source SC from point A to point D; the gas pressure is adjusted in order to collect continuously heat originating from the cold source SF. As with zone CB, it is preferable to keep the gas confined between the droplets at a temperature T2−∈, slightly lower than T2, by adjusting the pressure, such that there is a continuous thermal flow over the entire length of the exchanger, which enables the global flow to be maximised, whilst restricting the temperature difference ∈. According to the present invention, if a cold source at a constant temperature is considered, which is generally the case with geothermal heat pumps, each position corresponds to a temperature and given pressure.

The gas is then ready to be subjected to a new compression phase between D and C, as explained above.

This circuit may of course be used to cool the rooms of a dwelling; to do so the controls need merely be modified such that zone DC operates as an expander, and zone BA acts as a compressor, in order to absorb the heat in the area of the source at temperature T1, and to emit it in the area of the source at temperature T2.

Figure 8:
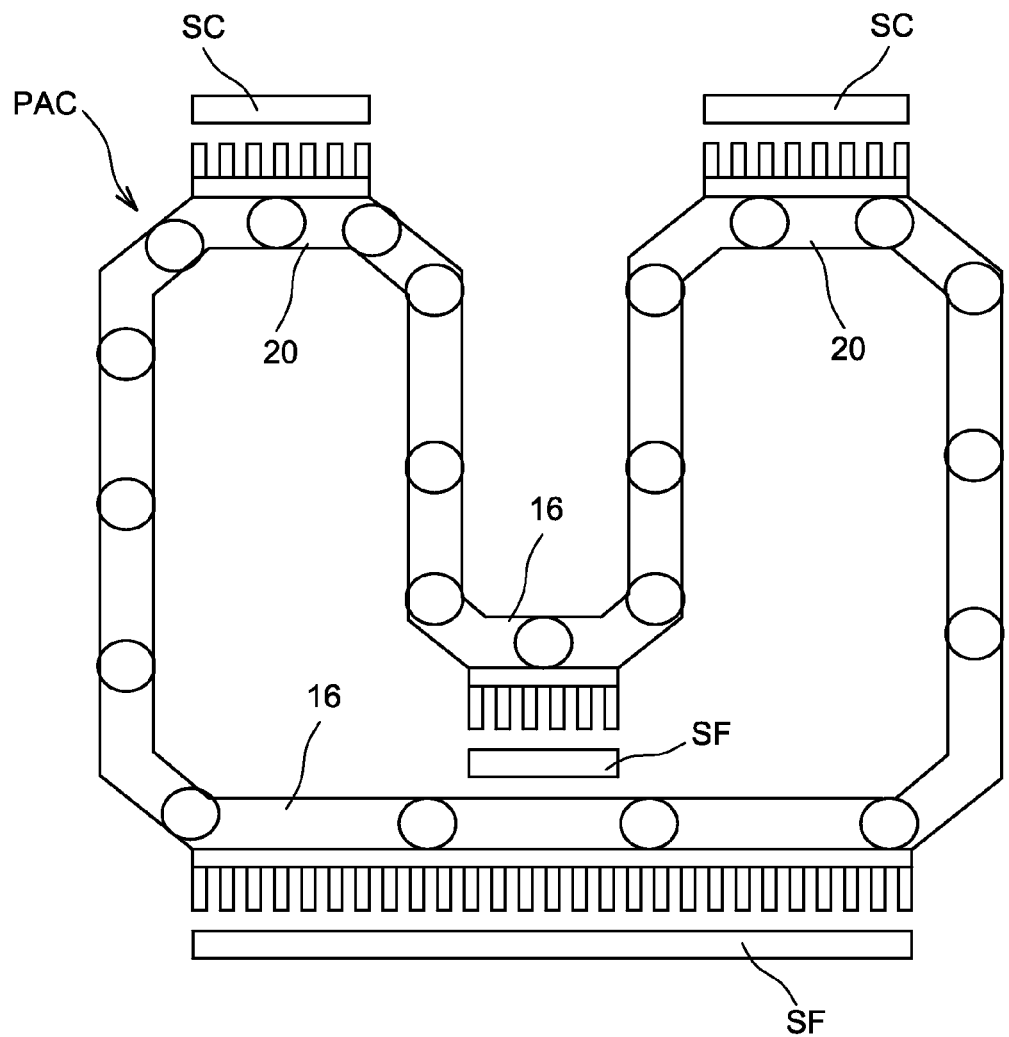

FIG. 8 shows an example of a heat pump according to the present invention comprising several thermal exchangers 2 with hot sources SC and several thermal exchangers 16 with cold sources SF which, in the case of a use as the heating system of a house, enables the pipe to follow a path through several rooms which it is desired to heat to different temperatures. Each of the rooms forms a heat source and the garden forms a cold source. The pipe can follow a path in the garden, or more generally into the ground, between each room which is to be heated. In this case the heat pump comprises several compressors and several expanders.

The adaptation of the temperature of each room is obtained, either at the time of manufacture, by adjusting the sizes of the electrodes, their spacing and their shapes, as in the device according to the second example, or by adjusting the control when the heat pump is installed.

In the represented examples of heat pumps the circuit is closed, and the droplets of liquid and the pneumatic fluid are reused in each cycle.

The choice can be made to renew the liquid and gas with each cycle, or after a certain operating time. It may happen, moreover, that certain droplets of liquid form groups, and that droplets evaporate or drift from their positions. The consequence of these modifications is to reduce the number of inter-droplet spaces or to modify the volume of the inter-droplet spaces; the heat pump is then less efficient since its control is less suited to the new characteristics of the pump.

The choice can then be made advantageously to insert into the circuit of the pump means to re-establish the initial characteristics of the heat pump, i.e. a recalibration of the pump.

To do this, the droplets of liquid are collected, and then new droplets are generated from the gathered liquid, where these new droplets will have the required size and will be spaced out relative to one another by a given distance.

Figure 7:
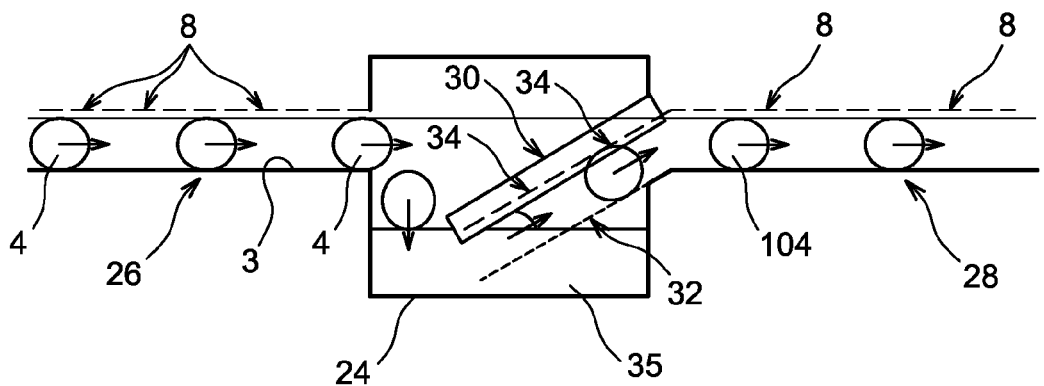

FIG. 7 shows an example of an embodiment of such means to re-establish the characteristics of the pump comprising a tank 24 connected to a pipe 26 where the droplets, called the used droplets, arrive, and a pipe 28 for evacuating the reformed droplets, called the new droplets.

Pipe 26 comprises means of displacement by electro-wetting to convey the droplets into tank 24; these are conveyed as far as the end of pipe 26 and fall under gravity into tank 24.

Means 30 to generate new droplets of liquid are comprised in the tank. These means are of the electro-wetting type, and comprise a reference electrode 32 and displacement electrodes 34. These means are shaped as a ramp emerging from the collected liquid 35, to convey the droplets 104 thus formed as far as the evacuation pipe 28. The reference electrode is, for example, a grille over which the new droplets will be conveyed. The means of generation by electro-wetting are advantageously combined with those intended to displace the droplets in the heat pump. The air or other gas is automatically confined between two droplets of liquid when they are formed. The droplets have the correct size and are spaced by a given distance.

The means of generation of new droplets are advantageously inserted in the circuit of the pump, in a zone where there is no pressure variation, for example in the areas of the sources T1 or T2. In this case the tank can at the same time play a role as an additional thermal exchanger. It can also be positioned in a zone exposed to ambient pressure, if there is such a zone, to facilitate maintenance, to enable the opening of the recycling device without risking the possibility of gas/liquid entering or leaving under the effect of higher pressure or lower pressure. It should be noted that the system can, globally, have a much higher pressure or a much lower pressure than the ambient pressure, and therefore have no ambient pressure zone.

As an example, the average pressure in the circuit may be between ambient pressure and ten times ambient pressure. Furthermore, the pressure difference in the circuit may be a factor of two between the lowest pressure and the highest pressure.

As was mentioned above, it is desired to undertake adiabatic compression and expansion phases, i.e. phases in which there is no heat exchange with the exterior, which amounts to having a zero thermal exchange between the inside of the pipe and the external environment.

The external environment may be, for example, a wall in the case of a heat pump used as a means of heating.

To this end, in manufacturing the pipe a material with low thermal conductivity is used.

By means of the present invention it is possible to reduce the thermal exchange flow by controlling the droplets; to do so the temperature of the gas is matched to the external temperature in order that the thermal exchange flow is zero. This is easily accomplished by adjusting the pressure of the pneumatic fluid by controlling the displacement electrodes.

For example, thermal exchange flow sensors are used to measure the value of the thermal exchange flow between the pipe and the external environment throughout the length of the pipe; these measurements are transmitted to the control unit which, depending on the values of the flow, can modify the control of the electrodes, individually or in groups, in order to cause the value of the flow to decrease towards zero.

For example, a wall separating the exterior from the interior of a house is subject to a thermal gradient. This wall is traversed by the heat pump; the part of the heat pump traversing the wall is, for example, the compressor or the expander, since the thermal exchangers are located either inside or outside the house. As was mentioned above, it is preferable that the compression and expansion are adiabatic, i.e. with no thermal flow towards the exterior.

By means of the invention and the use of thermal flow sensors, it is possible to adjust the pressure such that the temperature gradient in the pipe is very close, or identical, to the temperature of the wall, i.e. such that the temperature of the gas at all points in the pipe is equal or very close to the temperature in the wall.

It is also possible to use such flow sensors in the thermal exchange zones between C and B and A and D, in order to enable the control unit to set the flow to a particular setting, advantageously a low value, but one which is constant throughout the length of the thermal exchanger.

The liquid forming the droplets may be water or any other liquid. In the case of a heat pump, in which the cold source is the earth or the air, it is possible to use a liquid the solidification temperature of which is relatively low, lower than 0° C. The gas preferably has a satisfactory thermal exchange coefficient; it may be air or a single gas.

In the case of a heat pump the pipes have, for example, a diameter of 5 to 10 mm, and can be manufactured from copper or plastic. A thermal insulator may be added to the pipe in zones where it is not desired to have a thermal exchange with the exterior, i.e. the compression or expansion zones, for example. In the case of a channel made from a conductive material such as, for example, copper, the electrodes are positioned inside the channel and are insulated electrically from this channel. To this end, it is possible:

to deposit inside this channel a first insulating layer, of a plastic or other type, the thickness of which is between a few µm and 1 mm, after this, on this insulating layer, the electrodes can be deposited, with their electrical access track enabling them to be controlled, and to deposit on the electrodes an electrical insulating layer; the latter is preferably non-wetting for the envisaged liquid, i.e. hydrophobic in the case of an aqueous solution, or oleophobic in the case of a greasy substance.

The efficiency of such a heat pump according to the present invention implementing displacements by electro-wetting depends above all on the ratio between the electrostatic efforts which are applied and the friction efforts which are exerted between the droplets and the wall of the channel. I.e. the ratio between the electrostatic work applied, relative to the mechanical work dissipated in the form of friction. In the case of the present invention it is estimated that it is possible to obtain friction efforts four times lower than the applicable electrostatic efforts; efficiency ratings close to 75% of the theoretical Carnot efficiency may be expected. FIG. 6 of article "*Dynamics of droplet transport induced by electrowetting actuation*", Roland Bavière, Jérôme Boutet, Yves Fouillet, in *Microfluid Nanofluid*, Volume 4, Number 4/April 2008, DOI 10.1007/s10404-007-0173-4, which shows that, in the case of the given dimensions, 10 mN/m is required to overcome the friction efforts, and that it is possible to produce up to 40 mN/m.

The thermal losses relating to the thermal conduction of the channel linking the hot and cold zones must be taken into account; however, by using a relatively long channel the associated thermal losses can be considered to be negligible. The losses associated with the temperature drop $\in$ in the thermal exchangers must also be considered, but these losses are related to the operating principle of a thermal exchanger. Furthermore, due to the invention, the temperature drop $\in$ is small and adjustable, and the losses are therefore reduced.

The energy transfer is accomplished principally by gradual and guided variation of a gas. However, it is possible to conceive that the liquid droplets partially change state (of the order of a few percentage points of their volume), changing from the liquid state to the gaseous state, and vice versa, depending on the pressure/temperature conditions in the various zones of the channel. The changes of state of a part of the volume of the droplets are of course such that they do not cause a breach of the airtightness between two volumes of gas. This effect can be exploited to improve the quantity of transferred heat; in the low-pressure zones there is vaporisation of part of the volume of the droplets and an absorption of heat, and in the high-pressure zones there is condensation of the volume of the evaporated droplet, and a release of heat.

We have disclosed examples of embodiments in which the displacement of the droplets is obtained by electrostatic efforts, but it is also possible to envisage causing them to be displaced by means of electromagnetic forces. To accomplish this, droplets are used which have ferromagnetic properties, and which can therefore be sensitive to the magnetic field, for example droplets formed with a magnetorheological liquid. It is then possible to design means to generate a magnetic field distributed throughout the length of the channel, for example coils to replace the electrodes and to cause the droplets to move. This structure has the advantage that it poses no risk of dielectrical breakdown. The configurations of the examples represented in FIGS. 1 to 3 of course apply to the means of displacement by the electromagnetic forces.

In the case of a displacement by application of electrostatic forces the application of an effort is equivalent to giving the electrodes a certain electrical charge. In the case of a displacement by application of electromagnetic forces this is equivalent to applying a certain electrical current in the coils.

Figure 10A:
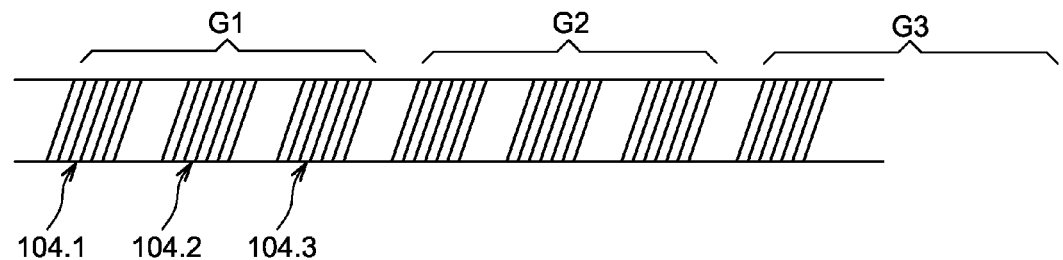
Figure 10B:
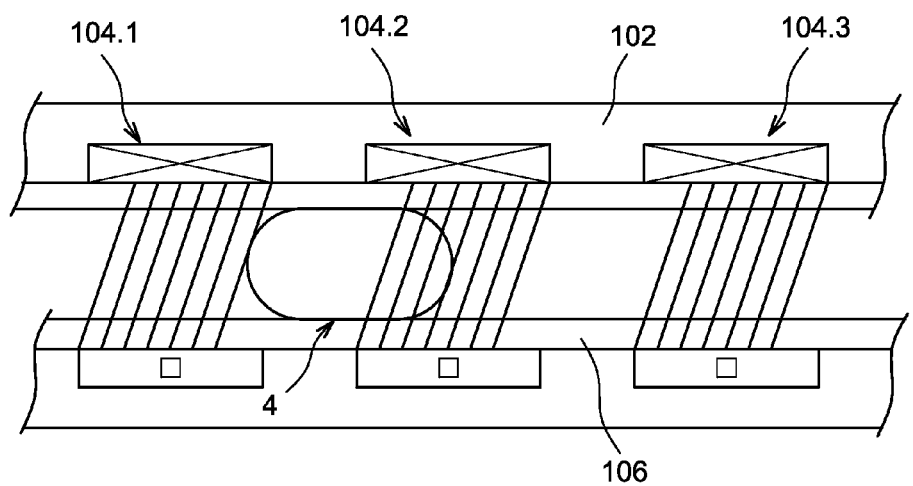

FIGS. 10A and 10B show a schematic representation of an example of an embodiment of a device using the electromagnetic forces.

This device comprises a channel 102 the inner surface of which 106 is non-wetting relative to the liquid of the droplets in question, where the liquid is a ferrofluid, of the coils 104.1, 104.2, 104.3 distributed along the length of the channel. The channel can be made from ferromagnetic material. In this case the coils are in groups G1, G2, G3, etc. of three electrodes as in the example of FIG. 2; one control for one triphase power supply can then be applied. In each group the coils are of variable size, or are spaced by a variable distance, in a manner similar to the examples disclosed in the case of a displacement by application of electrostatic forces.

Figure 11A:
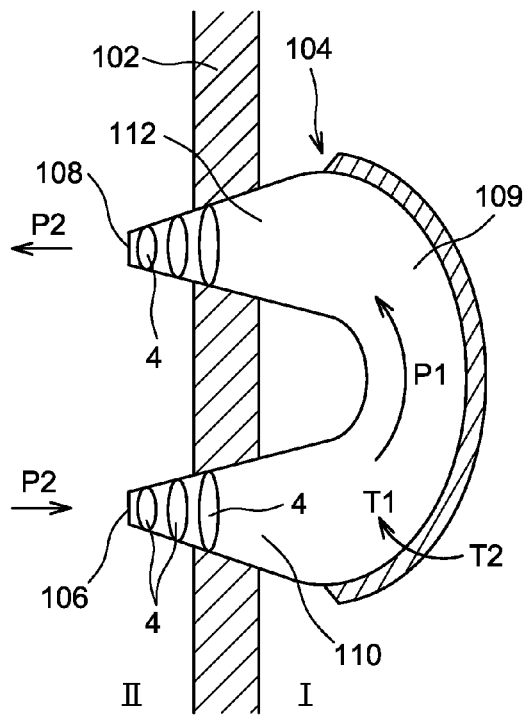
FIGS. 11A and 11B are schematic representations of another embodiment of a heat pump according to the present invention.
Figure 11B:
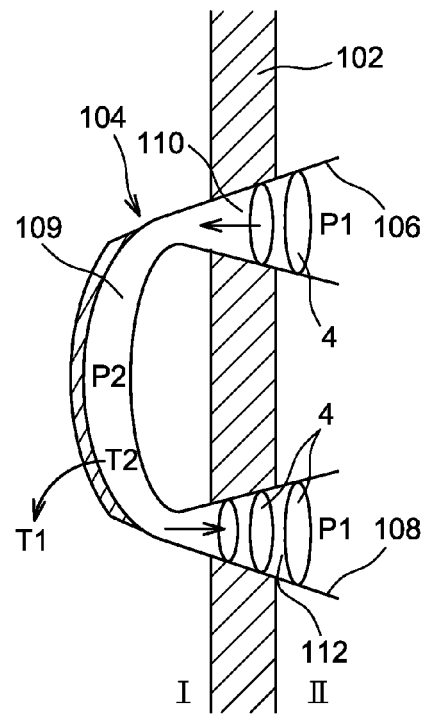

FIGS. 11A and 11B show another embodiment of a heat pump according to the present invention, notably distinguished from the heat pump of FIG. 8 by the fact that the system is open.

The heat pump example represented in FIG. 11A is intended to form an air-conditioning system of an interior zone I separated from an exterior zone II by a wall 102.

The heat pump comprises a pipe 104 fitted with two ends 106, 108, where the two ends of the pipe are located in the exterior zone II and the pipe 104 traverses the wall 102 in two locations and follows a path in the interior zone I.

The heat pump also comprises a zone 109 of thermal exchange with the interior zone I. In addition, according to the invention the device comprises a system for displacement of the droplets by electro-wetting or by electromagnetic forces of droplets of liquid as disclosed above, and a unit for control of displacement of the droplets able to cause the variation in pressure of the pneumatic fluid confined between the droplets.

In the represented example pipe 104 comprises end parts 110, 112 the profile of which has a variable section; more specifically end part 110, through which the air penetrates into the pipe 104, has a continually increasing section, and end part 112, through which the air exits the pipe 104, has a continually decreasing section.

We shall now explain the operation of this heat pump forming an air-conditioning system.

The air pressure in the exterior zone is P2. The air temperature of the interior zone is T2.

The air of the exterior zone II is confined between droplets of liquid 4, for example by means of a device of FIG. 7.

The droplets are driven by the displacement system, driving the air. Owing to the flared shape of the inlet part, the air confined between the droplets 4 gradually expands as it is displaced in the end part 110 of the pipe 104, reaching pressure P1. Its low temperature is equal to T1, lower than T2.

The gas at temperature T1 then reaches the thermal exchange zone 102, where the temperature of the interior zone T2 is higher than T1; the air in interior zone I loses heat to the gas in pipe 104.

The droplets continue their displacement, driving the heated air with them. The droplets and the gas then enter the evacuation end part 112 where the gas undergoes compression as a consequence of the reduction of the section of the evacuation end part, reaching pressure P2 of the exterior zone. The air is then released in the exterior zone.

Control of the pressure in the thermal exchange zone 109 is made possible through the compression in end part 112. More generally, by controlling the outflow of the gas at the exit of the pipe the pressure and temperature upstream from the outlet are controlled.

FIG. 11B shows a heat pump forming a heating system. In this case the air collected in the exterior zone II is compressed, and its temperature rises. It then exchanges its heat with the interior zone I, and is then expanded and evacuated to the exterior zone.

In addition, inlet end part 110 of the gas has a decreasing section to compress the gas, and evacuation end part 112 has an increasing section to expand the gas.

The pipes can of course be of constant section, where the variation of the pressure is obtained by varying the inter-droplet distance in order to expand or compress the gas, as in the other embodiments.

The operation is similar to that of the heat pump of FIG. 11A; it will not therefore be disclosed in detail.

The position of the thermal exchanger is not of course restrictive.

Figure 12A:
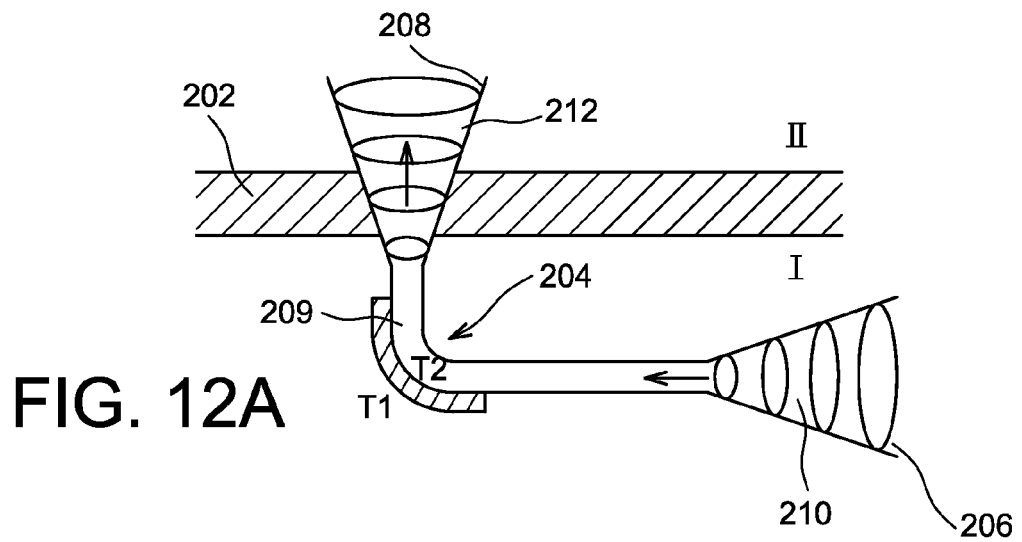
FIGS. 12A to 12C are schematic representations of another embodiment of a heat pump according to the present invention associated with an exchange of pneumatic fluid between two zones.
Figure 12B:
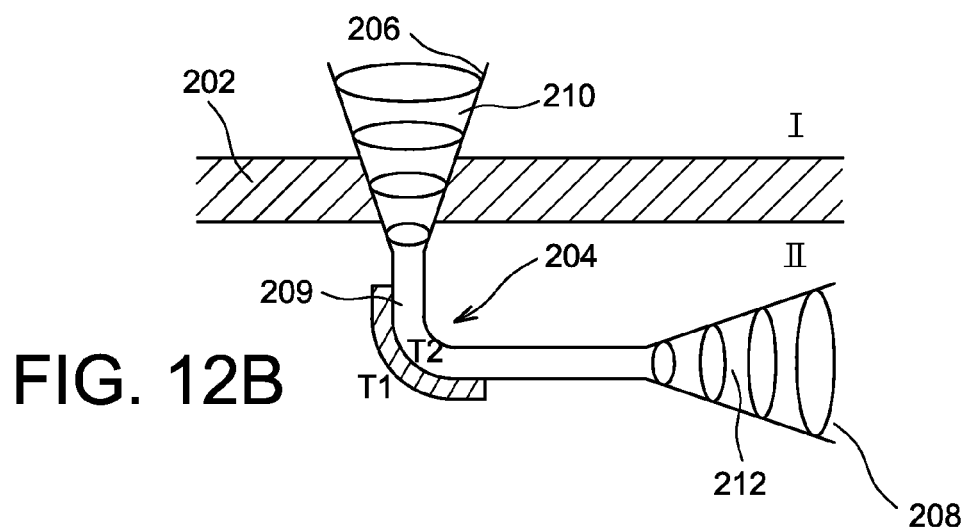
Figure 12C:
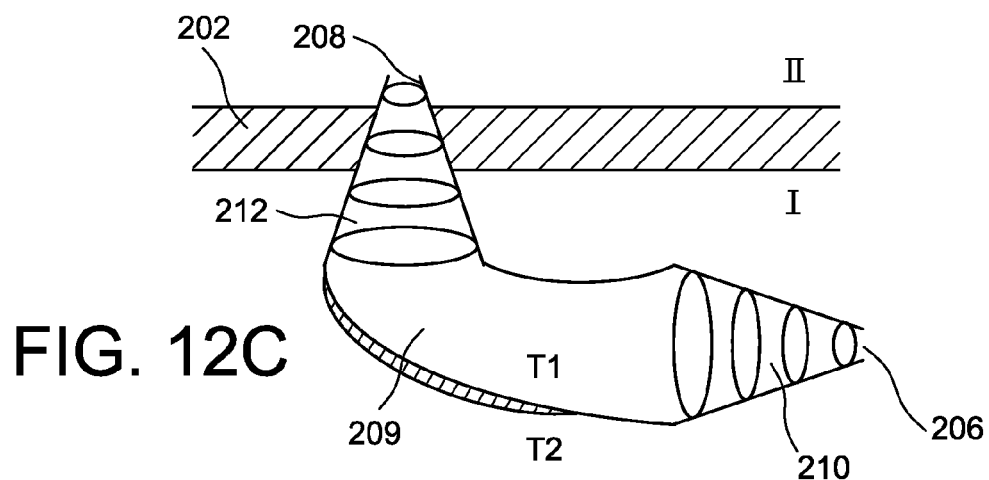

FIGS. 12A to 12C show another embodiment of a heat pump, the operation of which involves an exchange of air between the interior zone I and the exterior zone II.

In FIG. 12A the heat pump forms a heating system; it is therefore intended to contribute heat to the interior zone I.

The heat pump comprises a pipe 204, a first open end 206 of which is located in the interior zone I to be heated, and a second open end 208 is located in the exterior zone II.

The heat pump also comprises a system for displacement of the droplets by electro-wetting or by electromagnetic forces of droplets of liquid, and a unit for control of displacement of the droplets capable of causing a variation of the pressure of the air confined between the droplets.

The pipe comprises a first end part 210 in the interior zone I, and forms an air compressor, an intermediate heat exchange zone 209 with the interior zone I and a second end part 212 for air expansion.

In the represented example the compression and expansion are obtained by varying the sections of the pipes' end parts.

We shall explain the operation of the embodiment of FIG. 12A. The air in the interior zone is at T1.

The interior air is sucked in by the first end 206 and is confined between droplets of liquid, for example by the device in FIG. 7. The droplets are displaced and drive the air which is compressed owing to the shape of the first end part 210.

The air temperature gradually increases, reaching temperature T2, which is higher than T1. The air then circulates in the intermediate heat exchange zone 209, where temperature T1 in the interior zone is lower than temperature T2 of the air in the pipe 204; the air in pipe 204 transfers heat to the interior zone. The droplets continue their displacement and enter the second end part 212, where the air expands before being evacuated to the exterior zone II. In the course of expansion the air is slowed down and a part of the mechanical energy is converted into electrical energy, as explained above.

A system for introducing air into the interior zone I is of course also provided.

FIG. 12B shows a heat pump forming an air-conditioning system.

In this case the air is drawn in from the exterior zone II, and is then compressed; its temperature increases; in thermal exchange zone 209 the compressed air transfers heat to the exterior zone II; this air then expands, its temperature is reduced, and it is sent into the interior zone I, which it cools.

FIG. 12C shows another example of a heat pump operating as an air-conditioner, where the air is extracted from interior zone I. In this case the air of interior zone I is drawn in by the heat pump and is expanded; its temperature drops, by traversing thermal exchange zone 209; it absorbs heat from the interior zone I, and is then a compressed before being evacuated to the exterior zone.

This embodiment has the advantage that it forms a system in which the air circulates between the interior and the exterior.

Depending on the order of compression and expansion and the zones into which the air is drawn and from which it is discharged, cooling or heating systems are of course produced.

The heat pumps represented in FIGS. 11A to 12C can of course comprise several zones of compression, expansion and thermal exchange.

Figure 9A:
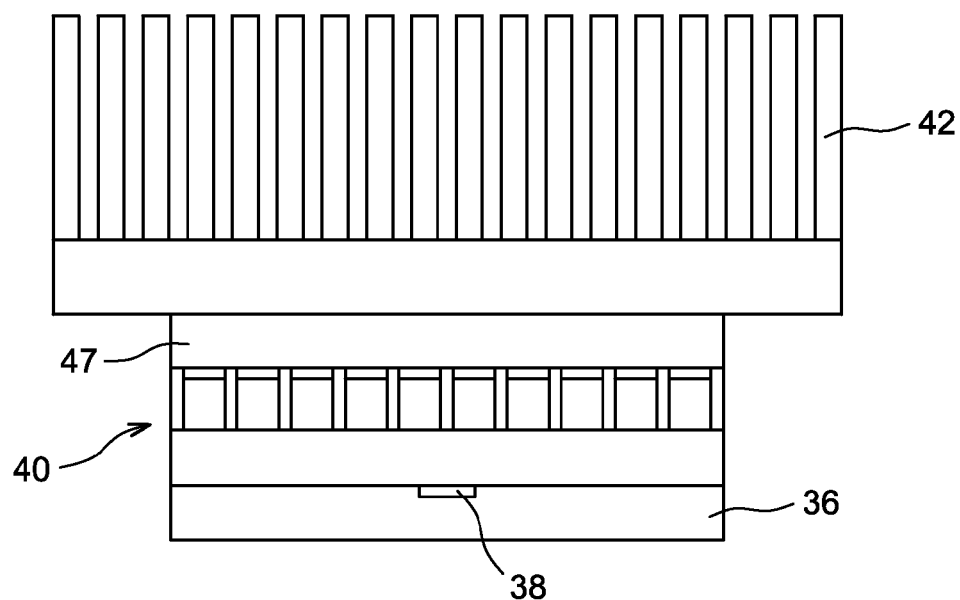
Figure 9B:
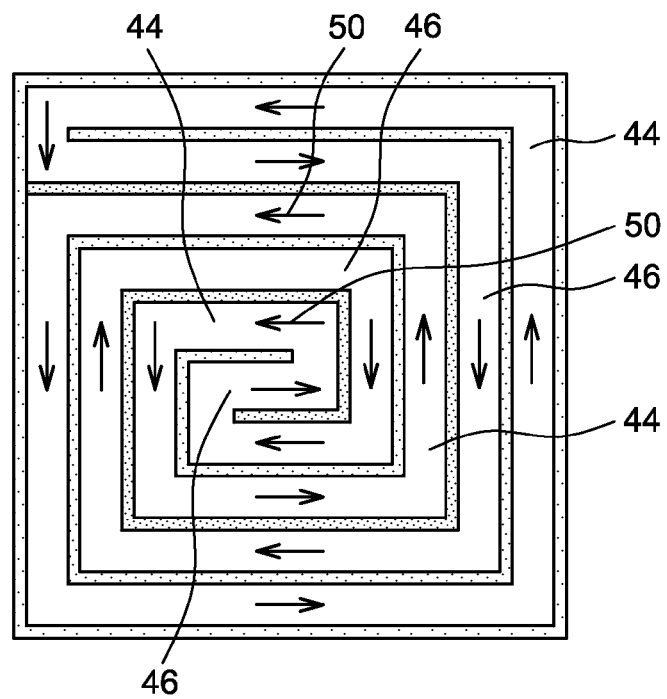
Figure 9C:
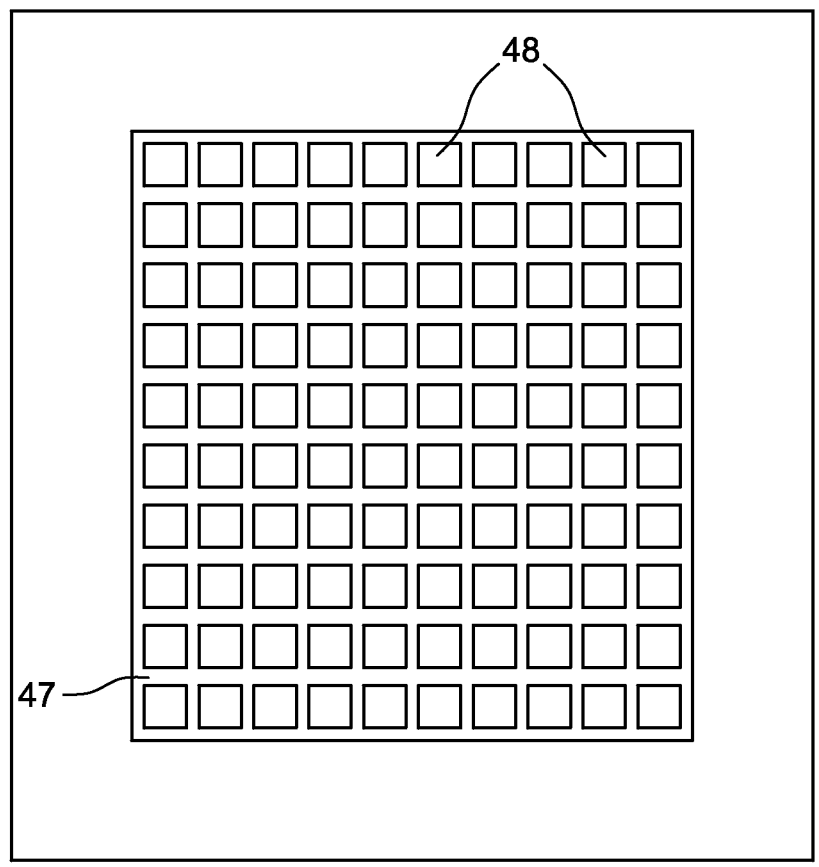

FIGS. 9A to 9C show an example of an application of the present invention to a cooling device for an electronic chip.

To cool electronic chips a radiator is deposited on them to facilitate the thermal exchange with the exterior.

An electronic chip is flat in shape, and the radiator is in contact with one of the flat faces of the chip. An electronic chip consists of several transistors each fulfilling a function; some of these transistors operate continuously, such as those relating to the clock, and others operate only at certain times. Consequently, certain transistors become very hot whereas others are only heated slightly; in the case of the latter the radiator is sufficient. However, in the case of those which become very hot the radiator does not permit a very effective emission of the heat. Indeed, since the heat to be emitted is very localised the thermal flow is very localised in the radiator, and the large exchange surface of the radiator is only very partially used.

By means of the present invention it is possible to distribute the heat to be dissipated more uniformly over the entire surface of the radiator.

FIG. 9A shows an electronic chip 36 with a critical hot point 38, a device for emitting the heat according to the present invention 40, and a radiator 42.

As can be seen in FIG. 9B, the device for emitting the heat 40 comprises two channels 44, 46, in the form of spirals centred on the hot point 38, where the channel 44 surrounds the channel 46.

FIG. 9C shows the upper face 47 of the cooling device forming the ceiling of device 40. In this example the displacement of the droplets is accomplished by electro-wetting. A displacement by electromagnetic force and a liquid having ferromagnetic properties could be used. The ceiling comprises displacement electrodes 48 arranged in a grid pattern such that it is opposite channels 44 and 46. These 20 electrodes 48 are insulated electrically from the liquid droplets by the deposit of a layer which is either both electrically insulating and hydrophobic in relation to the droplets, or the deposit of an electrically insulated layer, for example such as a layer of un-doped silicon on which a layer of polytetrafluoroethylene is deposited.

The reference electrode is formed, either directly by the bottom of the channels, if the latter are slightly conductive, or by a deposit of a conductor in the bottom of the channels or on their wall. It is possible, for example in the event that the channels are made of silicon, to dope some of the channels. The size of the conducting zone can be very fine compared to the width of the channels.

As in the other examples of embodiments, very hydrophobic surfaces 30 relative to the droplets of liquid are used, to reduce the losses by friction, for example through the deposit of a layer of polytetrafluoroethylene.

Droplets of liquid are positioned in the channels and are displaced by means of the displacement electrodes, as described above, and the droplets are separated by a gas.

We shall now disclose the operation of this cooling device.

The central part of the device, in particular of the channel 44, forms a thermal exchanger, and the gas trapped between two droplets absorbs heat from the hot point.

The droplets travel in channel 44 in the direction of the arrows 50; this gas will then be compressed by bringing the droplets closer together.

In the outer most part of channel 44, and also in that of channel 46, the gas then emits heat towards the external environment.

The gas is then expanded until it returns to the area of the hot point, when it undergoes a new cycle.

Using the device according to the invention there is a distribution of the heat to be emitted over the entire surface of the radiator, since the fluid follows the path through the entire radiator. In addition, there is also a lateral emission of the heat through the outer part of the channel.

The closer the channels 44, 46 pass to the transistors to be cooled, the more efficient the device.

It is also possible to manufacture channels in two different planes, one plane on the side of the electronic chip from which it is desired to extract the heat, and one plane on the side of the radiator in which it is emitted to the exterior via the radiator. In this case the heat, in addition to being conveyed from the centre to the edges, is absorbed over the entire surface and removed vertically from the electronic chip, improving the cooling further.

The cooling device may be manufactured, for example, on the rear face of the electronic chip to be cooled by deep engraving the silicon part, or by cutting channels directly in an additional thickness of insulator deposited on the electronic chip. It is also possible to engrave a silicon plate and to add it on to the chip.

The various configurations of the displacement electrodes and their associated control of course apply to this cooling device.

The heat pump according to the invention can undertake other types of thermodynamic cycles than the Joule-Brayton cycle: for example, it can enable the dithermal Carnot cycle, the four-stroke cycle and the Stirling cycle to be undertaken. This is made possible by the fact that the present invention enables the pressure values of a gas in circulation to be adjusted at any point of the space, which points of space may be considered at a fixed temperature, in the area of the thermal exchangers or, conversely, may be considered as completely thermally insulated, in the area of the compressors and the expanders.

The circuit according to the invention used as a heat pump can also operate as a generator which generates electrical energy from a temperature difference. In this case, the temperature difference to be generated need merely be higher than the temperature difference produced by the high pressure/low pressure in thermally insulated mode. Indeed, in this case, the application of the external temperature gradient tends not to reduce but to increase the temperature difference between the high pressure zones and the low pressure zones, enabling more mechanical work to be restored during the depression phase than that which is consumed in the pressurisation phase.

The operating principle is then the same as in the case of the heat pump; the difference relates solely to the sign of $\in$. Indeed, in order for the external environment to contribute energy to the system the temperature of the channel on the hot side is at $T1-|\in|$ instead of $T1+|\in|$ and reciprocally on the cold side the temperature is at $T2+|\in|$ instead of $T2-|\in|$.

Since the Carnot efficiency is this time directly proportional to the absorbed temperature difference, it is advantageous to maximise it; and it is equal to $T1-T2-2|\in|$. It is therefore, as in the case of the heat pump, advantageous to minimise, the value of $\in$, in absolute value terms, and at the same time to keep it constant throughout the entire length of the exchanger in order to maximise the thermal flow and therefore the quantity of thermal energy converted.

In the case of the recovery of electrical energy the compression and expansion phases are still present. In the case of compression, a contribution of electrical energy is required to force the displacement of the droplets and to increase the pressure of the gas between D and C. Conversely, in the expansion phase, instead of advancing the droplets through a contribution of electrical energy, they are slowed down, and this slowing energy is transformed into electrical energy. The electrical power consumed to increase the pressure between D and C, which is equal to be Contributed Power=Pressure Increase*Flow Rate, is easily compensated by the energy recovered during the expansion, which is equal to Recovered Power=Pressure Loss*Flow Rate. Indeed, the gas flow rate is higher during expansion than during compression since the volume of gas has increased due to the increase of temperature. The recoverable power is in fact equal to the difference of flow rate between the expansion and the compression multiplied by the pressure difference between the hot side and cold side; this pressure difference is related to the sought temperature difference: $T1-T2-2|\in|$.

When it is displaced the droplets of liquid is in contact with the reference electrode and forms an electrode which is mobile relative to the displacement electrode. The unit consisting of the displacement electrode, the dielectric layer and the droplet of liquid therefore forms a variable capacity condenser.

Indeed, in a condenser the relationship between the charge (Q), the capacity (C) and the voltage (V) between the electrodes is as follows:

$$Q = C \times V \quad (1),$$

and the energy is given by the following relationship:

$$E = \frac{1}{2} QV, \quad (2)$$

A reduction of capacity with a constant charge consequently causes an increase of the voltage V, and therefore an increase of the energy E.

By causing the droplets to move in zone D to C, for example by electro-wetting, the droplets arrive in the thermal exchange zone CB. The inter-droplet gas is heated in zone CD; as a consequence the inter-droplet distance increases. The droplets are then in phase-lead in zone BA. The droplet therefore forms a variable capacity condenser with the previous displacement electrode. By injecting and removing a charge when the capacity of the condenser is respectively maximal and minimal it is possible to recover electrical energy. The energy of slowing down the droplet is in fact converted into electrical energy.

The control methods described in the context of operation as a heat pump can be applied precisely in the same way in the context of the generation of electrical energy, the sole difference being that it is necessary that the pressures in the exchangers on the hot and cold sides lead to a temperature which is slightly lower than T1 on the hot side and slightly higher than T2 on the cold side.

The present invention can be applied in many fields, and notably:
- in heating or air-conditioning systems in construction (heating by heat pump), as has been disclosed in detail,
- in refrigerating machines,
- in the cooling of electronic components,
- for chemical or biological analysis; for example, in the case of bacteria carried in the liquid droplets, which are able to follow desired temperature cycles,
- in the field of recovery of energy from a thermal gradient by imposing the temperature difference, the electrical energy recovered during the movement from the hot zone to the cold zone is then greater than the electrical energy contributed in moving from the cold zone to the hot zone.

The invention claimed is:

1. A device for varying a pressure of a pneumatic fluid, comprising:
   a channel in which travel multiple droplets of hydraulic fluid which are at some distance from one another, and
   at least one of electrodes and magnetic field generators configured to displace said droplets in the channel using at least one of electrostatic and electromagnetic forces, wherein said pneumatic fluid is confined in an airtight fashion between the droplets of hydraulic fluid to form at least a first, a second and a third successive volume of pneumatic fluid, and wherein the forces applied by said at least one of electrodes and magnetic field generators increase or reduce a pressure of the pneumatic fluid from the first to the third volume of pneumatic fluid and also increase or reduce the volume between the droplets in a given displacement direction, respectively causing a compression or an expansion of the pneumatic fluid in a gradual manner.

2. The device for varying a pressure of a pneumatic fluid according to claim 1, where said at least one of electrodes and magnetic field generators comprise a reference electrode with which the droplets are in permanent contact, and separate displacement electrodes configured to be charged to a variable potential, and where the displacement electrodes are grouped in groups, said groups succeeding one another in the displacement direction of the droplets, and where a control unit applies an identical control to each of the groups to cause lesser or greater distance between the droplets in the direction of displacement of the droplets.

3. The device for varying a pressure of a pneumatic fluid according to claim 2, where a distance separating the displacement electrodes is lessened or increased in an unvarying fashion in the direction of displacement of the droplets, where said at least one of electrodes and magnetic field generators are controlled by a voltage.

4. The device for varying a pressure of a pneumatic fluid according to claim 3, in which said displacement electrodes are of a variable dimension in an unvarying fashion in the direction of displacement of the droplets.

5. The device for varying a pressure of a pneumatic fluid according to claim 1, wherein said at least one of electrodes and magnetic field generators comprise multiple magnetic field generators, where said generators are grouped into groups of generators succeeding one another in the displacement direction of the droplets, and where the control unit applies an identical control to each of the groups to cause greater closeness or greater distance between the droplets in the displacement direction of the droplets.

6. The device for varying a pressure of a pneumatic fluid according to claim 5, where a distance separating said generators is lessened in the displacement direction of the droplets, and where said at least one of electrodes and magnetic field generators are controlled by a voltage.

7. The device for varying a pressure of a pneumatic fluid according to claim 1, in which an inner surface of the pipe is non-wetting with regard to the droplets.

8. A heat pump comprising at least two devices according to claim 1, in which at least one comprises a control unit such that it forms a compressor of the pneumatic fluid, in which at least one other device comprises a control unit such that it forms an expander of the pneumatic fluid, in which said pump also comprises at least one thermal exchanger linking the compressor to the expander, and in which said at least one compressor, said at least one expander and said at least one thermal exchanger form a single channel.

9. The heat pump according claim 8, in which a high-pressure end of the compressor is connected to a high-pressure end of the expander through a thermal exchanger of a hot source, and a low-pressure end of the expander is connected to a low-pressure end of the compressor through a thermal exchanger with a cold source, the unit formed by the compressor, the expander and the thermal exchangers forming a single channel, pressures of the pneumatic fluid in the thermal exchangers being such that a temperature of the pneumatic fluid in the thermal exchanger of the hot source is higher than a first temperature, and the temperature of the pneumatic fluid in the thermal exchanger of the cold source being lower than a second temperature.

10. The heat pump according to claim 8, in which the thermal exchangers are formed by pipes with at least one of electrodes and magnetic field generators using at least one of electrostatic forces and electromagnetic forces, each of these exchangers comprising a control unit to control a pressure and temperature of the pneumatic fluid confined between the droplets.

11. The heat pump according to claim 10, comprising a single control unit for the compressor, the expander and the thermal exchangers, where the latter sends separate orders to each one.

12. The heat pump according to claim 8, comprising several devices forming compressors, several devices forming expanders and several thermal exchangers.

13. The heat pump according to one claim 8, in which the devices forming the compressor and the expander comprise thermal flow sensors on walls of the channel to measure a thermal flow between the channel and outside, where the control unit is able to act on the at least one of electrodes and magnetic field generators to reduce an absolute value of the thermal flow, so as to obtain compressions and expansions which are essentially adiabatic.

14. The heat pump according to claim 8, in which the thermal exchangers are formed by pipes with at least one of electrodes and magnetic field generators using at least one of electrostatic forces and electromagnetic forces, each of these exchangers comprising a control unit to control a pressure and temperature of the pneumatic fluid confined between the droplets and in which the thermal exchangers comprise flow sensors enabling the control unit to adjust a displacement of the droplet to maintain a thermal flow which is essentially constant.

15. The heat pump according to claim 8, comprising a calibrator of the droplets in a circuit and their relative positions.

16. The heat pump according to claim 15, in which said calibrator comprises a tank with an orifice to let in used droplets and an orifice for supply of the circuit of renewed droplets, and means for forming droplets by electro-wetting, the tank collecting the used droplets, and the means for formation of droplets using the collected hydraulic fluid to form new droplets.

17. The heat pump according to claim 15, in which the means for formation of droplets comprise a ramp emerging from the collected hydraulic fluid, and connected to the supply orifice, the ramp forming the reference electrode, and the displacement electrodes being positioned opposite it.

18. The heat pump according to claim 8, in which the channel is open and comprises two ends communicating either with a hot source, or with a cold source, the pneumatic fluid being subject to the expansion, the compression being of air taken from the hot source or the cold source, and the thermal exchanger exchanging heat with the cold source or the hot source.

19. The heat pump according to claim 8, in which the channel is open and comprises two open ends, where one of the open ends is located in a hot source and the other end in a cold source, the pneumatic fluid being air which is drawn in from the hot source or the cold source, and being released into the cold source or the hot source, respectively, and the thermal exchanger being located in the hot source or the cold source, such that there is an exchange of air between the hot source and the cold source.

20. A heat pump comprising;
an expander;
a compressor;
a thermal exchanger linking the compressor to the expander;
a channel in which travel multiple droplets of hydraulic fluid distant from one another;
at least one of electrodes and magnetic field generators configured to displace said droplets between a first and second point in the channel using at least one of electrostatic and electromagnetic forces, a pneumatic fluid being confined in an airtight manner between the droplets of hydraulic fluid to form at least a first, a second and a third successive volume of pneumatic fluid, and
a control unit for controlling the at least one of electrodes and magnetic field generators, where commands issued by the control unit displace the droplets such that a pressure of the pneumatic fluid increases or is reduced gradually from the first to the third volume of pneumatic fluid and the volume between the droplets gradually increases in a part of the channel corresponding to the compressor, or gradually reduces in a part of the channel corresponding to the expander, thus causing a compression and an expansion of the pneumatic fluid between the first and second points of the channel, and where the compressor, the expander and the thermal exchanger form a single channel.

21. A system for cooling an electronic chip comprising the heat pump according to claim 8.

22. A system for cooling an electronic chip comprising the heat pump according to claim 20.

23. The system for cooling an electronic chip according to the claim 22, in which a high-pressure end of the compressor is connected to a high-pressure end of the expander through a thermal exchanger of a hot source, and a low-pressure end of the expander is connected to a low-pressure end of the compressor through a thermal exchanger with a cold source, the unit formed by the compressor, the expander and the thermal exchangers forming a single channel, the pressures of the pneumatic fluid in the thermal exchangers being such that the temperature of the pneumatic fluid in the thermal exchanger of the hot source is higher than a first temperature, and the temperature of the pneumatic fluid in the thermal exchanger of the cold source being lower than a second temperature and in which the single channel of the heat pump is formed in a rear face of said chip, where the single channel is formed by a first spiral forming the thermal exchanger with the cold source formed by the chip and the compressor, where a second spiral forms the thermal exchanger with the hot source formed by an external environment and the expander, where the first spiral surrounds the second spiral, and where the cooling system comprises a radiator on the heat pump on an opposite side of the electronic chip, with the single channel winding under the radiator.

24. The cooling system according to the claim 23, where the first spiral allows a thermal exchange directly with the external environment, in addition to the exchange with the radiator.

25. The cooling system according to one of claim 22, in which the single channel is engraved directly in the rear face of the electronic chip, or is engraved in an insulating plate added on to the chip.

26. The cooling system according to one of claim 22, in which the single channel is positioned in two parallel planes.

27. A device for converting thermal energy into electrical energy comprising at least two devices according to claim 1, one comprising a control unit such that it forms a compressor of the pneumatic fluid, where a high-pressure end of the compressor is connected to a high-pressure end of the expander through a thermal exchanger of a hot source at a first temperature, and where a low-pressure end of the expander is connected to a low-pressure end of the compressor by a thermal exchanger with a cold source at a second temperature, where the unit formed by the compressor, the expander and the thermal exchangers forms a single channel, and where the pressures of the pneumatic fluid in the thermal exchangers are such that the temperature of the pneumatic fluid in the thermal exchanger of the hot source is lower than the first temperature, and the temperature of the pneumatic fluid in the thermal exchanger of the cold source is higher than the second temperature.

28. The device for converting thermal energy into electrical energy according to claim 27, in which the thermal exchangers are formed by pipes fitted with at least one of electrodes and magnetic field generators using at least one of electrostatic forces and electromagnetic forces, where each of these exchangers comprises a control unit to control the pressure and temperature of the pneumatic fluid confined between the droplets.

29. A device for varying a pressure of a pneumatic fluid, comprising:
a channel in which travel multiple droplets of hydraulic fluid which are at some distance from one another, and
at least one of electrodes and magnetic field generators configured to displace said droplets in the channel using at least one of electrostatic forces and electromagnetic forces; wherein the electrodes comprise a reference electrode with which the droplets are in permanent contact and a plurality of separate displacement electrodes configured to be charged to a variable potential, wherein said pneumatic fluid is confined in airtight fashion between the droplets of hydraulic fluid, and wherein the forces applied by said at least one of electrodes and magnetic field generators increase or reduce a volume between the droplets in a given displacement direction, respectively causing a compression or an expansion of the pneumatic fluid in a gradual manner, said device comprising at least a first, a second and a third successive volume of pneumatic fluid, where a pressure of the pneumatic fluid increases or is reduced gradually from the first to the third volume of pneumatic fluid by a control unit applying a command to the displacement electrodes or to the magnetic field generators to bring droplets closer together or to move droplets further apart in the displacement direction of the droplets, such that the pressure of the pneumatic fluid is increased or decreased progressively from the first volume to the third volume of the pneumatic fluid.

30. The device for varying a pressure of a pneumatic fluid according to claim 3, where said at least one of electrodes and magnetic field generators are controlled by a 3-phase voltage.

31. The device for varying a pressure of a pneumatic fluid according to claim 7, in which the inner surface of the pipe comprises at least one of a hydrophobic surface and an oleophobic surface.

\* \* \* \* \*